United States Patent [19]
Reay

[11] Patent Number: 6,005,414
[45] Date of Patent: Dec. 21, 1999

[54] MIXED-MODE MULTI-PROTOCOL SERIAL INTERFACE DRIVER

[75] Inventor: Robert Loren Reay, Mountain View, Calif.

[73] Assignee: Linear Technology Corporation, Milpitas, Calif.

[21] Appl. No.: 08/868,311

[22] Filed: Jun. 3, 1997

[51] Int. Cl.[6] .............................................. H03K 19/0185
[52] U.S. Cl. .................. 326/83; 326/63; 326/86
[58] Field of Search ................................. 375/257, 259; 326/83, 86, 62, 63; 327/103, 104

[56] References Cited

U.S. PATENT DOCUMENTS

| | | | |
|---|---|---|---|
| 4,852,041 | 7/1989 | Nakano | 395/500 |
| 4,884,287 | 11/1989 | Jones et al. | 375/377 |
| 4,972,470 | 11/1990 | Farago | 380/3 |
| 5,179,586 | 1/1993 | Lee | 326/86 |
| 5,257,289 | 10/1993 | Jopson | 375/257 |
| 5,457,784 | 10/1995 | Wells et al. | 395/500 |
| 5,832,244 | 11/1998 | Jolley et al. | 395/309 |

OTHER PUBLICATIONS

"LTC1321/LTC1322/LTC1335 RS232/EIA562/RS485 Transceivers," data sheet, *1994 Linear Databook, vol. III*, pp. 5–198 to 5–215, Linear Technology Corporation, Milpitas, CA (1994).

"LTC1318 Single 5V RS232/RS422/Appletalk® Transceiver" data sheet, *1994 Linear Databook, vol. III*, pp. 13–79 to 13–84, Linear Technology Corporation, Milpitas, CA (1994).

"SP503 Multi–Mode Serial Transceiver, " data sheet, *Interface Products Catalog*, pp. 193–219, Sipex Corporation, Billerica, MA (1994).

*Primary Examiner*—Michael Tokar
*Assistant Examiner*—Don Phu Le
*Attorney, Agent, or Firm*—Fish & Neave; Robert W. Morris; Garry J. Tuma

[57] ABSTRACT

A mixed-mode multi-protocol serial interface driver is presented. The driver operates in current-mode, voltage-mode, or both, and includes circuitry for conforming output signals to one of a plurality of selectable electrical interface standards, including, for example, CCITT/EIA standards V.35, V.11/RS-422, V.28/RS-232, and V.10/RS-423. A mode-select input signal selects a particular standard, and appropriate portions of the circuitry are enabled in response. Portions of the circuitry not enabled are placed in a high impedance state to prevent their interference with the enabled portions.

41 Claims, 5 Drawing Sheets

MIXED-MODE MULTI-PROTOCOL SERIAL INTERFACE DRIVER

BACKGROUND OF THE INVENTION

This invention relates to serial communication between electronic devices. More particularly, this invention relates to multi-protocol serial interface drivers.

Communication between electronic devices, such as, for example, computer processors, modems, network controllers, disk drives, and printers, is accomplished by transmitting information (e.g., data and control signals) either serially or in parallel. Serial communication involves the sequential transmission of data bits across a single conductor, while parallel communication involves the simultaneous transmission of multiple data bits across separate, parallel conductors. Although parallel communication is faster than serial communication, the notably higher cost of parallel cable generally limits parallel communication to devices that are in close proximity to each other, such as, for example, a computer and a nearby printer. Accordingly, most electronic communication is accomplished serially.

Information is typically transmitted in an encoded sequence of binary signals (i.e., logical 1's and logical 0's). To properly interpret such signals, communicating devices must be able to equate the particular voltage level of each transmitted signal with a logical 1 or logical 0. Thus compatibility between communicating devices is needed to ensure that each device properly receives the transmitted information. Otherwise, for example, if one device sends data with logical 1's and 0's at voltages of +/−2 volts, respectively, and the receiving device expects logical 1's and 0's at voltages of +/−8 volts, respectively, the transmitted information will be lost.

To prevent such difficulties, electrical interface standards were developed. These standards provide electrical specifications, known as protocol, which specify the formats (e.g., the voltage levels) for signals transmitted between communicating devices. Thus, if each device adheres to the same standard, the devices can exchange information.

Over the years, however, many standards evolved to cover either broad areas of information transmission or unique requirements in specific applications. For example, in the United States, the Electronics Industries Association (EIA) developed a number of different standards, such as, for example, RS-232, RS-422, and RS-423. Similarly in Europe, the Comité Consultif Internationale Télégraphique et Téléphone (International Consultative Committee for Telegraph and Telephone, or CCITT) also developed a number of different standards, such as, for example, V.10, V.11, V.28, and V.35. For the most part, the EIA and CCITT standards are compatible. For example, RS-422 is compatible with V.11, RS-232 is compatible with V.28, and RS-423 is compatible with V.10. These interface standards have been accepted generally by most manufacturers of electronic data transmission and business equipment.

For those cases in which a device needs to communicate with another device that either adheres to a different interface standard or has generally incompatible electrical signal parameters, an interface driver can be used to permit the devices to communicate. Interface drivers convert the signals from the transmitting device's format to the receiving device's format, thus permitting information to be exchanged.

If a device is to communicate with multiple other devices, two or more of which adhere to different interface standards, multiple interface drivers are needed. However, such multiple interface drivers either undesirably require manual switching of cables to connect the appropriate driver, or require cumbersome, expensive, and tedious-to-implement switching relay circuits that automatically select the appropriate interface driver. Furthermore, while some multi-protocol interface drivers have been developed that can conform signals selectably to more than one interface standard, typically, however, these multi-protocol interface drivers have difficulty properly conforming output signals to each standard, particularly, for example, the V.35 standard.

Proper adherence to the V.35 standard is best achieved with an interface driver that operates in current-mode. Current-mode operation refers to the driver's output current being substantially independent of output voltage. Known multi-protocol interface drivers, however, typically operate in voltage-mode, which refers to the driver's output voltage being substantially independent of output current.

Voltage-mode multi-protocol drivers that purport to adhere to the V.35 standard usually have difficulty doing so, because they cannot easily supply current at a constant enough level to meet the standard's specified voltage across a specified load. Current-mode drivers, in contrast, are designed to provide a constant current. Thus, maintaining a particular voltage across a specified load is more easily accomplished.

Furthermore, voltage-mode drivers cannot easily provide the standard's specified output impedance, because voltage-mode drivers inherently have low output impedance (100 ohms or less). Such low output impedance adversely affects the impedance typically provided by termination resistors. Termination resistors are needed to properly terminate the driven output line. Additionally, variations in manufacturing process (e.g., oxide thicknesses), operating temperature, and supply voltage cause the driver output impedance to vary, further increasing the difficulty of selecting appropriately valued termination resistors that will result in an equivalent impedance meeting the specification.

In contrast, current-mode drivers typically have very high output impedance, which has no substantial affect on the output impedance provided by termination resistors. Thus, termination resistors alone can be used to provide the standard's specified output impedance.

While the V.35 standard is strictly adhered to, for example, in Europe, the same has not been true in the United States. However, with the globalization of international telephone and computer networking communications, strict adherence to the V.35 standard will soon be required in the U.S. Thus a multiprotocol serial interface driver that strictly adheres to the V.35 standard will also soon be required. But, designing a mixed-mode (i.e., operation in both current-mode and voltage-mode) multi-protocol interface driver presents several difficulties.

In particular, because the output of such a driver is shared among different driver circuits, it is difficult to prevent the different circuits from interfering with each other. For example, it is very difficult to keep the driver circuits not currently in use from undesirably turning ON (i.e., conducting) when output voltages exceed the supply voltages.

Output voltages can exceed the supply voltages when, for example, an output line with multiple drivers is conforming an output signal to an interface standard that has high voltage swings, such as, for example, RS-232, which typically has swings of +/−8 volts while other drivers have a typical supply voltage of +5 volts. Variations in ground voltage and test equipment usage can also cause output voltages to exceed supply voltages.

Such large output voltages can force inherent well and substrate transistor diodes in the circuits into conduction, thus forcing those transistors into conduction. Accordingly, circuitry is needed to place and maintain the driver circuits not currently being used in a high impedance state.

In view of the foregoing, it would be desirable to provide a mixed-mode multi-protocol interface driver that can conform an output signal to one of a plurality of selectable electrical interface standards.

It would also be desirable to provide a mixed-mode multi-protocol interface driver that can operate selectably in current-mode, voltage-mode, or both.

It would further be desirable to provide a mixed-mode multi-protocol interface driver that can place and maintain portions of its circuitry in a high impedance state.

SUMMARY OF THE INVENTION

It is an object of this invention to provide a mixed-mode multi-protocol interface driver that can conform an output signal to one of a plurality of selectable electrical interface standards.

It is also an object of this invention to provide a mixed-mode multi-protocol interface driver that can operate selectably in current-mode, voltage-mode, or both.

It is a further object of this invention to provide a mixed-mode multi-protocol interface driver that can place and maintain portions of its circuitry in a high impedance state.

In accordance with this invention, there is provided a multi-protocol serial interface driver that includes an input terminal, a mode-select input terminal, first and second output terminals, and circuitry for conforming an output signal to one of a plurality of selectable electrical interface standards, wherein the interface driver operates in current-mode for conforming an output signal to at least one of those selectable electrical interface standards.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
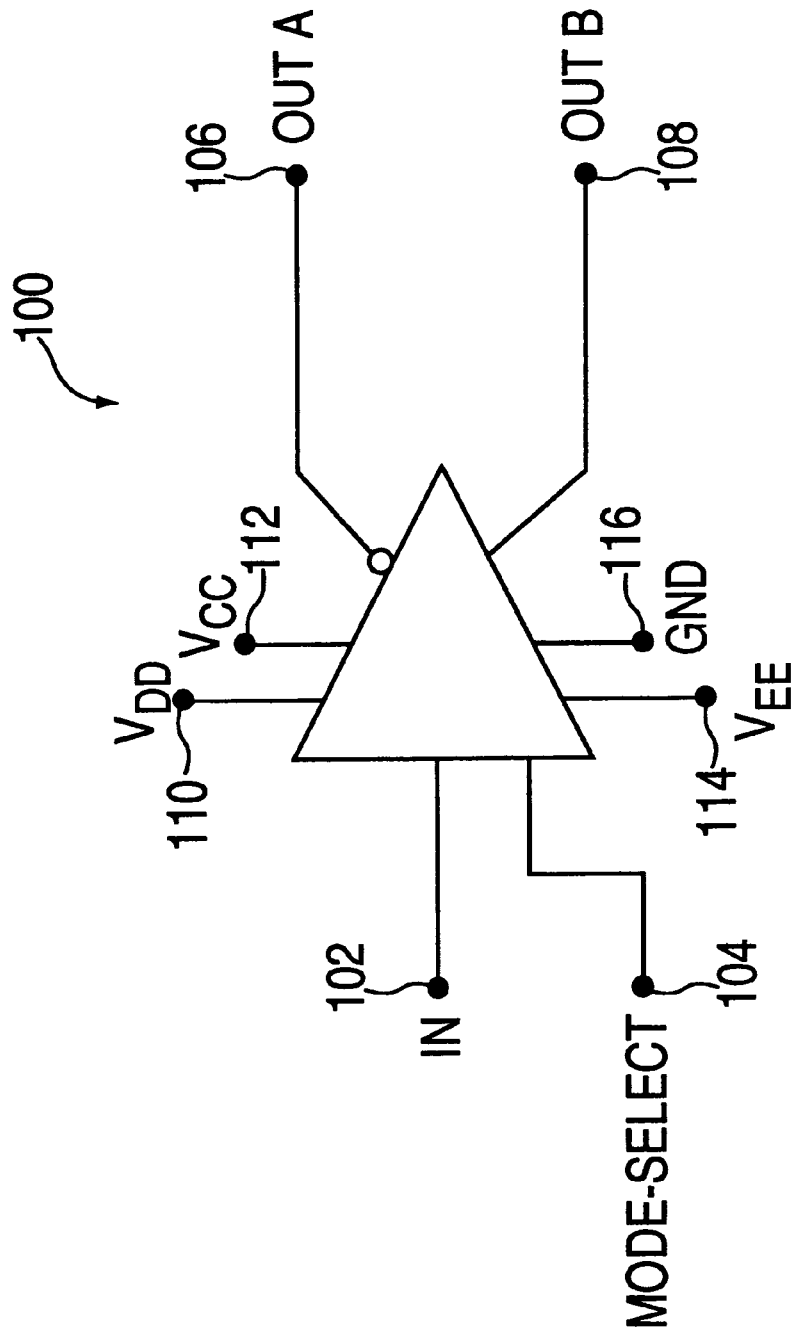
FIG. 1 is a representational block diagram of a mixed-mode multi-protocol serial interface driver according to the present invention.

The present invention provides a mixed-mode multi-protocol serial interface driver for conforming output signals to one of a plurality of selectable electrical interface standards. FIG. 1 is a representational block diagram of a serial interface driver according to the present invention. Output signals can be conformed selectably to, for example, one of the following CCITT/EIA interface standards: V.35, V.11/RS-422, V.28/RS-232, and V.10/RS-423. Interface driver 100 includes circuitry that can operate in voltage-mode, current-mode, or both, and has input terminal 102, a mode-select input terminal 104, output terminals 106 and 108, and power supply terminals 110, 112, 114, and 116.

Output terminals 106 and 108 provide inverted and non-inverted output signals, respectively, of the input signal received at terminal 102. Thus a differential, or balanced-line, output can be provided for those interface standards that require such outputs. The logic value of a differential output signal is determined by the difference between the two output signal voltages. For example, to output a logical 0, the voltage at output 106 must be greater than the voltage at output 108. This is typically accomplished by outputting a logical 1 at output 106 and a logical 0 at output 108. Conversely, to output a logical 1, the voltage at output 108 must be greater than the voltage at output 106. Similarly, this is typically accomplished by outputting a logical 0 at output 106 and a logical 1 at output 108. The various interface standards specify the amount by which the two output voltages must differ in order to be interpreted as a logical 1 or a logical 0. The advantage of such outputs is noise immunity; any noise that appears on one of the two output lines is likely to appear on the other as well, and is thus canceled as the difference between the two output signal voltages is taken. Balanced-line drivers include those that meet the V.35 and V.11/RS-422 standards.

For those interface standards specifying a single-ended output, such as, for example, the V.10/RS-423 or V.28/RS-232 standards, output 106 is used alone.

Mode-select input terminal 104 couples mode-select signals to the interface driver. Mode-select signals indicate which electrical standard the driver is to conform output signals to. These mode-select signals are preferably coupled to driver 100 via a mode-select bus (not shown). Alternatively, a serial mode-select line may be provided, in which case, driver 100 would include multiplexing circuitry (known in the art and not shown) to demultiplex and direct the mode-select signals to the appropriate portions of driver 100 circuitry. Accordingly, input terminal 104 preferably accommodates multiple parallel lines, but may alternatively accommodate a single mode-select line. Mode-select input terminal 104 is coupled to mode-select circuitry within driver 100.

In response to a particular mode-select signal, portions of driver 100 circuitry are enabled and other unused portions are placed in a high impedance state to prevent their interference (e.g., unnecessary loading) with the enabled portions. Only those portions of circuitry that conform output signals to a particular electrical standard are enabled at any one time.

Power supply terminals 110, 112, 114, and 116 couple driver 100 to supply voltages VDD, VCC, VEE, and ground, respectively. These voltages power the driver and enable it to provide the proper output voltage levels to meet a selected electrical interface standard. Voltages for VDD, VCC, and VEE are typically approximately +8 volts, +5 volts, and −5 volts to −8 volts (depending on the standard), respectively. A charge pump (known in the art and not shown) preferably provides VDD and VEE. Furthermore, the charge pump regulates VEE between −5 volts and −8 volts based on the mode-select signals, and is powered by VCC and ground. Other embodiments may include other supply voltages in accordance with the particular standards being adhered to, and such other supply voltages may be provided by external sources or a charge pump.

Figure 2:
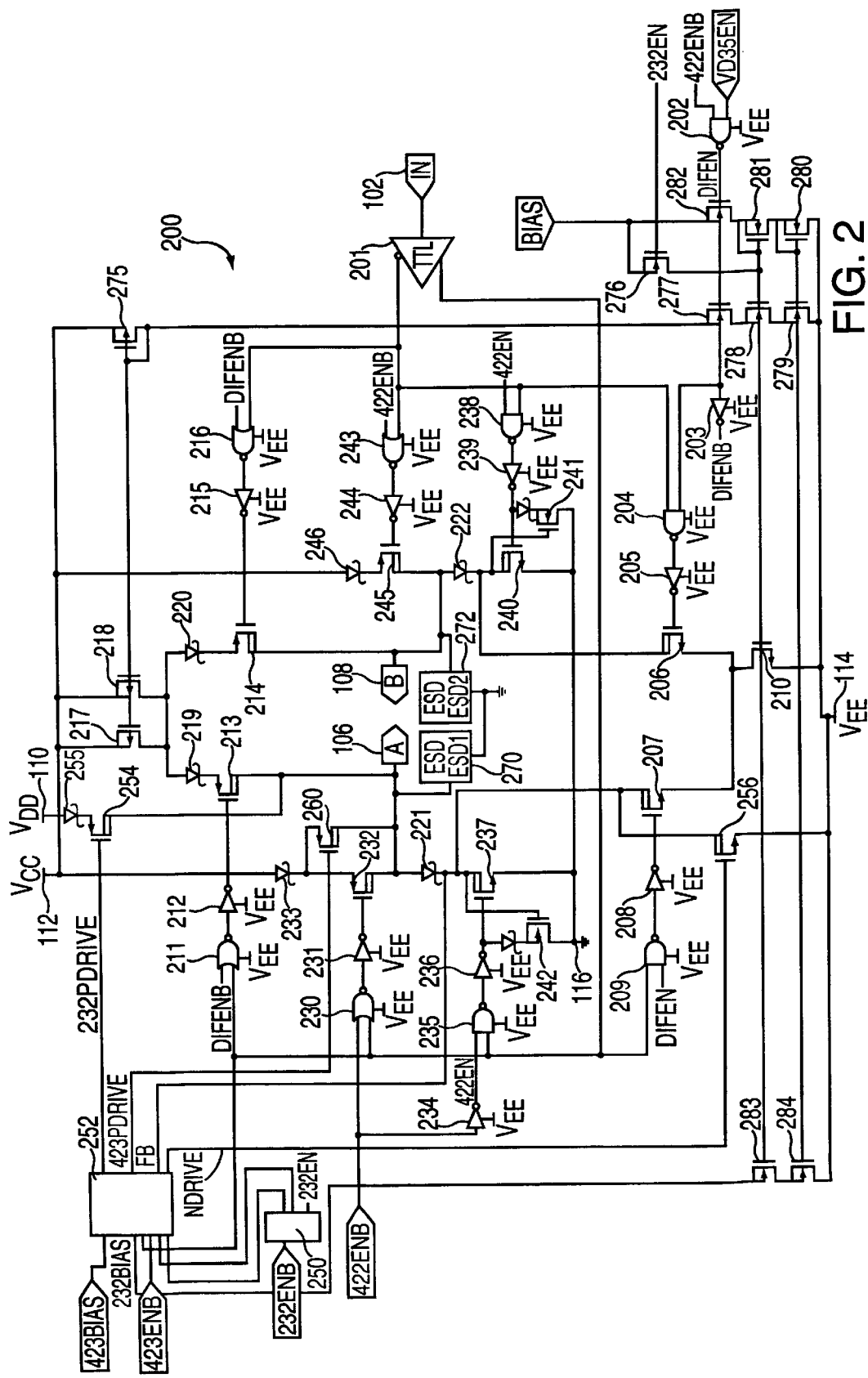
FIG. 2 is a schematic block diagram of a preferred embodiment of circuitry for the interface driver of FIG. 1 according to the present invention.

A preferred embodiment of the circuitry of driver 100 is shown in the schematic block diagram of FIG. 2 in accordance with the present invention. Circuitry 200 is preferably fabricated as an integrated circuit on a single electronic chip and packaged in a single electronic module. Preferably, the charge pump (not shown), if provided, is fabricated on the same chip as circuitry 200. Alternatively, circuitry 200 may be fabricated in discrete portions (e.g., multiple chips) that ultimately share common input and output lines in the final package, which may be a module with multiple chips, a printed circuit board comprising a number of components, or other known electronic package or assembly. An advantage of the present invention is the sharing of input and output lines by the different portions of circuitry 200.

Circuitry 200 is preferably implemented in CMOS (complimentary metal-oxide-semiconductor) technology, but other circuit technologies may be used instead, such as, for example, bipolar technology. CMOS circuits include two types of transistors, PMOS and NMOS. PMOS transistors are devices that are driven into conduction (i.e., turned ON) by applying a logical 0 to their gate, while NMOS transistors are driven into conduction by applying a logical 1 to their gate. Conversely, PMOS transistors are driven out of conduction (i.e., turned OFF) by applying a logical 1 to their gate, while NMOS transistors are driven out of conduction by applying a logical 0 to their gate.

Circuitry 200 operates in current-mode, voltage-mode, or both to conform an output signal to one of a number of selectable electrical interface standards. Current-mode operation refers to the driver's output current being substantially independent of output voltage, and voltage-mode operation refers to the driver's output voltage being substantially independent of output current. In this embodiment, circuitry 200 can operate in current-mode to conform output signals to the V.35 standard, voltage-mode to conform output signals to the V.28/RS-232 and V.10/RS-423 standards, and both current-mode and voltage-mode to conform output signals to the V.11/RS-422 standard. Normally, the V.11/RS-422 standard is met by voltage-mode operation only; however, concurrent voltage-mode and current-mode operation results advantageously in the reduction of some transistor device sizes.

An advantage of the present invention is the inclusion of current-mode operation for conforming output signals to, for example, the V.35 standard. The V.35 standard requires a differential voltage of 0.55 volts with a 20% tolerance across a 100-ohm test load resistor connected between outputs 106 and 108. A voltage-mode driver has difficulty meeting that standard because, for example, a varying supply voltage can cause current through the load resistor to vary enough such that the differential voltage exceeds the acceptable tolerance of the standard. Variations in manufacturing process (e.g., oxide thicknesses) and operating temperature can also cause the same result. However, by providing an interface driver that operates in current mode, variations in supply voltage, process, and temperature have little to no affect on output current, because the transistors are operating in saturation mode. Thus current through the load resistor is substantially constant, and accordingly, the differential voltage is substantially constant. Furthermore, because accurate current sources and load resistors can be manufactured using current design techniques, the variation in differential voltage can be kept under 20%. The V.35 standard is therefore advantageously met by an interface driver that operates in current-mode.

Circuitry 200 receives an input signal at input terminal 102 and feeds that signal to differential driver circuit 201. Driver 201 outputs an inverted and a non-inverted signal. These signals are then applied to mode-select circuits that, in conjunction with mode-select signals received at terminal 104 (not shown), enable particular portions of circuitry 200 to conform an output signal to a selected electrical interface standard. Moreover, the mode-select circuits place the unused portions of circuitry in a high-impedance state.

Mode-select circuits include NAND gates 202, 204, 209, 235, and 238; NOR gates 211, 216, 230, and 243; and inverting drivers 203, 205, 208, 212, 215, 231, 236, 239, and 244. Each of these devices is powered by negative voltage supply VEE, which results in transistor threshold voltages of approximately ground.

For operation as a current-mode balanced-line interface driver to conform an output signal to the V.35 standard, circuitry 200 receives mode-select signal VD35ENB via mode-select input terminal 104 (not shown in FIG. 2) and feeds that signal to NAND gate 202. The output of NAND gate 202 is fed to NAND gates 204 and 209 and inverting driver 203. The output of driver 203 is fed to NOR gates 211 and 216. NOR gate 216 and NAND gate 204 also receive the inverted input signal from driver 201, while NAND gate 209 and NOR gate 211 also receive the non-inverted input signal from driver 201. The outputs of NAND gates 204 and 209 are fed to inverters 205 and 208, respectively, which drive (i.e., control the turning ON and turning OFF of) NMOS transistors 206 and 207, respectively. The outputs of NOR gates 211 and 216 are fed to inverters 212 and 215, respectively, which drive PMOS transistors 213 and 214, respectively.

This portion of circuitry 200 further includes PMOS transistors 217/218, which form a first current source, and NMOS transistor 210, which forms a second current source. Supply voltage VCC is provided at terminal 112 to PMOS transistors 217/218, and supply voltage VEE is provided at terminal 114 to NMOS transistor 210. Diodes 219, 220, 221, and 222, which are discussed further below, complete the current-mode portion of circuitry 200 enabled by signal VD35ENB. Output terminals 106 and 108 provide the balanced-line output signal, and all other transistors are placed in a high impedance state (i.e., are turned OFF).

Figure 3:
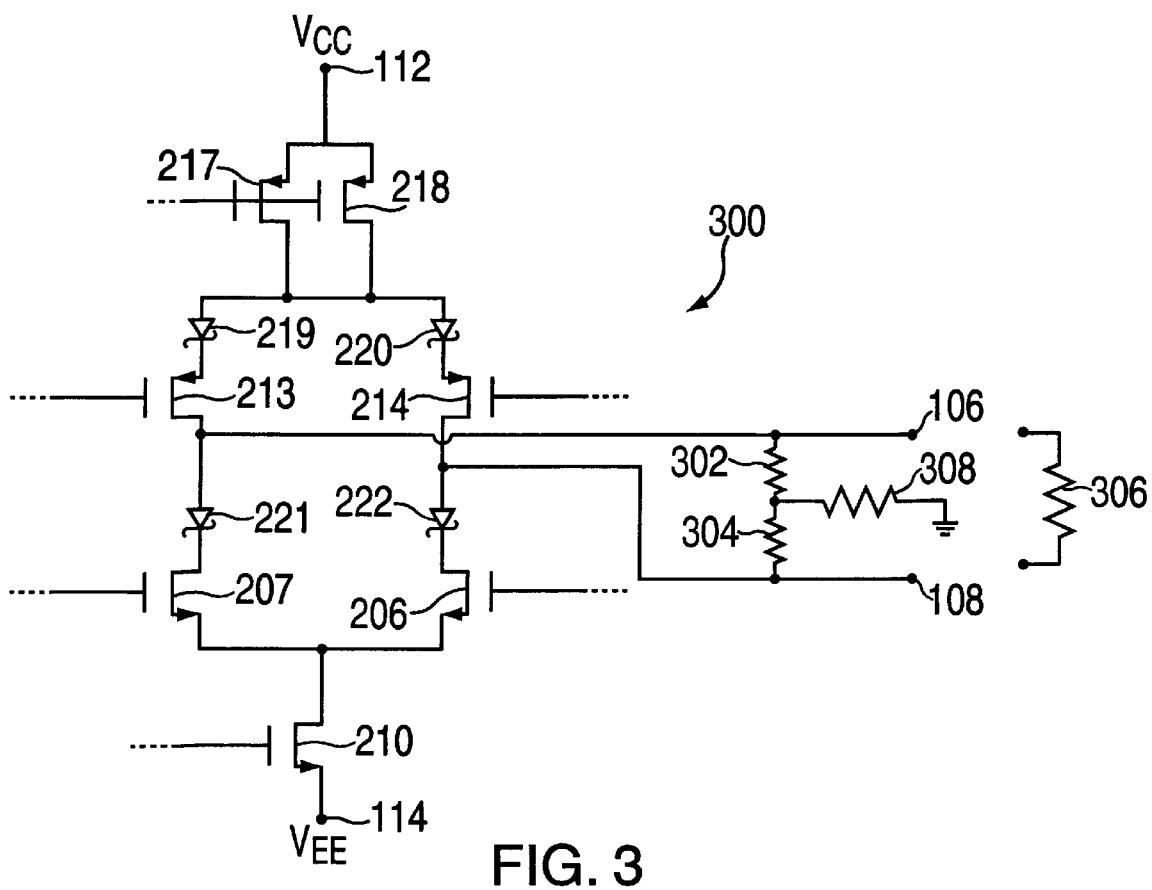
FIG. 3 is a schematic diagram of a portion of the circuitry of FIG. 2, which can be used to conform output signals to the V.35 electrical interface standard.

For clarity, the output stage of the current-mode portion of circuitry 200 is redrawn in FIG. 3. If the input signal is a logical 0, then the voltage at output 106 is high (e.g., a logical 1) while the voltage at output 108 is low (e.g., a logical 0). Accordingly, PMOS transistor 213 and NMOS transistor 206 are ON (i.e., conducting) while PMOS transistor 214 and NMOS transistor 207 are OFF. Constant current is thus supplied to a load at terminal 106 by PMOS current source transistors 217/218 and at terminal 108 by NMOS current source transistor 210.

Conversely, if the input signal is a logical 1, then the voltage at output 106 is low while the voltage at output 108 is high. Accordingly, PROS transistor 213 and NMOS transistor 206 are OFF, while PMOS transistor 214 and NMOS transistor 207 are ON. Constant current is then supplied to a load at terminal 108 by PMOS current source transistors 217/218 and at terminal 106 by NMOS current source transistor 210.

The V.35 standard defines output voltage levels of +/−2 volts and, as discussed previously, a differential voltage of 0.55 volts with a 20% tolerance across a 100-ohm load connected between outputs 106 and 108. Further, the standard specifies that the differential output impedance of the driver should be 100 ohms and that the common mode impedance should be 150 ohms.

These specifications are met by designing current source transistors 210 and 217/218 to generate approximately 11 mA each, and by selecting termination resistors 302, 304, and 308 to be approximately 50 ohms, 50 ohms, and 125 ohms, respectively. Termination resistors are used between two communicating devices to properly terminate the line (e.g., to prevent undesirable signal reflections).

The load impedance becomes the equivalent impedance of the series combination of termination resistors 302 and 304 in parallel with the 100-ohm test load resistor 306:

$$(50+50) \| 100 = 50 \text{ ohms}$$

The voltage drop across this equivalent impedance is then:

$$50 \text{ ohms} * 11 \text{ mA} = 0.55 \text{ volts}$$

The variation in output voltage can be kept within the 20% tolerance by using standard design techniques to fabricate accurate current source transistors and termination resistors.

Because current source transistors 210 and 217/218 have extremely high output impedance, the driver output impedances (differential and common mode) are determined solely by the resistors. Thus the differential impedance is calculated by summing resistors 302 and 304 as follows:

$$50+50 = 100 \text{ ohms}$$

And the common mode impedance is found by shorting output 106 to output 108 and then measuring the equivalent impedance to ground. Thus parallel resistors 302 and 304 are combined and added to resistor 308 as follows:

$$(50 \| 50) + 125 = 25 + 125 = 150 \text{ ohms}$$

Accordingly, this portion of circuitry 200, operating in current-mode, meets the specifications for the V.35 electrical interface standard.

When current-mode circuitry is placed in a high impedance state (i.e., the current-mode transistors are turned OFF) and other portions of circuitry 200 are then enabled, diodes 219, 220, 221, and 222, which are preferably Schottky diodes, prevent the current-mode transistors from undesirably turning back ON. This is accomplished by preventing the inherent well and substrate diodes of those transistors from forward-biasing, and thus conducting, if the output voltages are forced beyond the supply voltages. Output voltages can exceed supply voltages when, for example, other drivers that have voltage swings greater than the supply voltage are used; other causes include variations in ground voltage and test equipment usage. The Schottky diodes also permit a high impedance state to be maintained when power is removed from circuitry 200. Thus, these high impedance features advantageously permit the various portions of circuitry 200 to share output lines without interfering with each other.

For operation as a balanced-line driver in both current-mode and voltage-mode to conform an output signal to the V.11/RS-422 standard, circuitry 200 receives mode-select signal 422ENB via mode-select input terminal 104 (not shown in FIG. 2) and feeds that signal to NOR gates 230 and 243. NOR gates 230 and 243 also receive respectively the non-inverted input signal and the inverted input signal from driver 201. The outputs of NOR gates 230 and 243 are then fed to inverting drivers 231 and 244, respectively, which drive PMOS transistors 232 and 245, respectively.

Mode-select signal 422ENB is also fed to inverting driver 234, which provides an inverted mode-select signal to NAND gates 235 and 238. NAND gates 235 and 238 also receive respectively the non-inverted input signal and the inverted input signal from driver 201. The outputs of NAND gates 235 and 238 are then fed to inverting drivers 236 and 239, respectively, which drive NMOS transistors 237 and 240, respectively.

Mode-select signal 422ENB is further fed to NAND gate 202, which enables the same current-mode circuitry as described previously for mode-select signal VD35ENB. Operation in both current-mode and voltage-mode advantageously permits smaller transistors to be used for the voltage-mode circuitry, thus advantageously reducing the integrated circuit area needed to implement circuitry 200.

Also included in this portion of circuitry 200 are NMOS transistors 241 and 242, which limit the current provided to outputs 106 and 108. Diodes 233, 246, 221, and 222, all preferably Schottky diodes, prevent the inherent well and substrate diodes of transistors 232, 245, 237, and 240 from undesirably turning ON (thus preventing the transistors themselves from turning ON) when this portion of circuitry 200 is in a high impedance state and subjected to output voltages that exceed the supply voltages. Supply voltage VCC is provided at terminal 112 to PMOS transistors 232 and 245, and ground is provided at terminal 116 to NMOS transistors 237 and 240. All other transistors in circuitry 200 are placed in a high impedance state.

Figure 4:
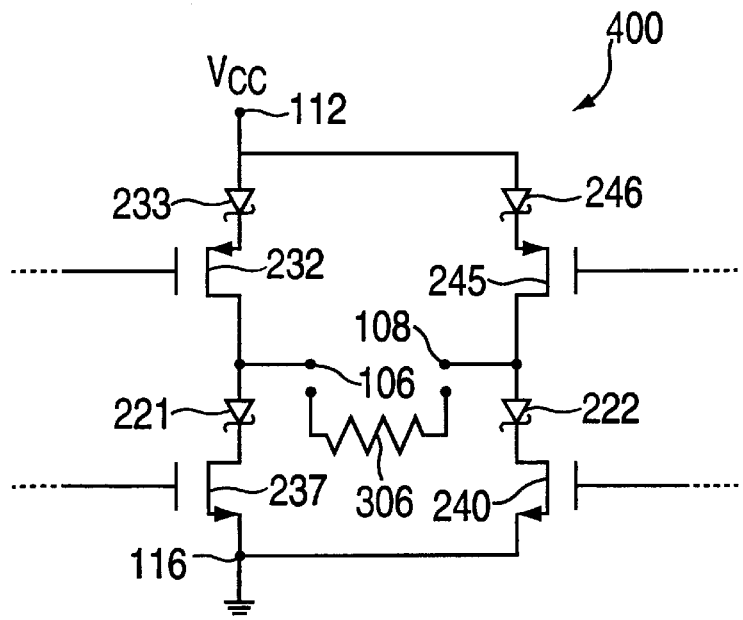
FIG. 4 is a schematic diagram of another portion of the circuitry of FIG. 2, which can be used to conform output signals to the V.11/RS-422 electrical interface standard.

For clarity, the output stage of the voltage-mode portion of circuitry 200 is redrawn in FIG. 4. If the input signal is a logical 0, then the voltage at output 106 is high and the voltage at output 108 is low. Accordingly, PMOS transistor 232 and NMOS transistor 240 are ON, and PMOS transistor 245 and NMOS transistor 237 are OFF. Conversely, if the input signal is a logical 1, then the voltage at output 108 is high and the voltage at output 106 is low. Accordingly, PMOS transistor 245 and NMOS transistor 237 are ON, and PMOS transistor 232 and NMOS transistor 240 are OFF.

The V.11/RS-422 standard specifies that the voltage across a 100-ohm load (test load resistor 306) connected between outputs 106 and 108 must be at least 2.0 volts. With VCC approximately equal to +5 volts and a voltage drop across each diode-transistor pair (e.g., diode 233 and transistor 232) of typically less than 1 volt, the voltage across resistor 306 is approximately 3 volts, thus clearly meeting this standard.

Figure 7:
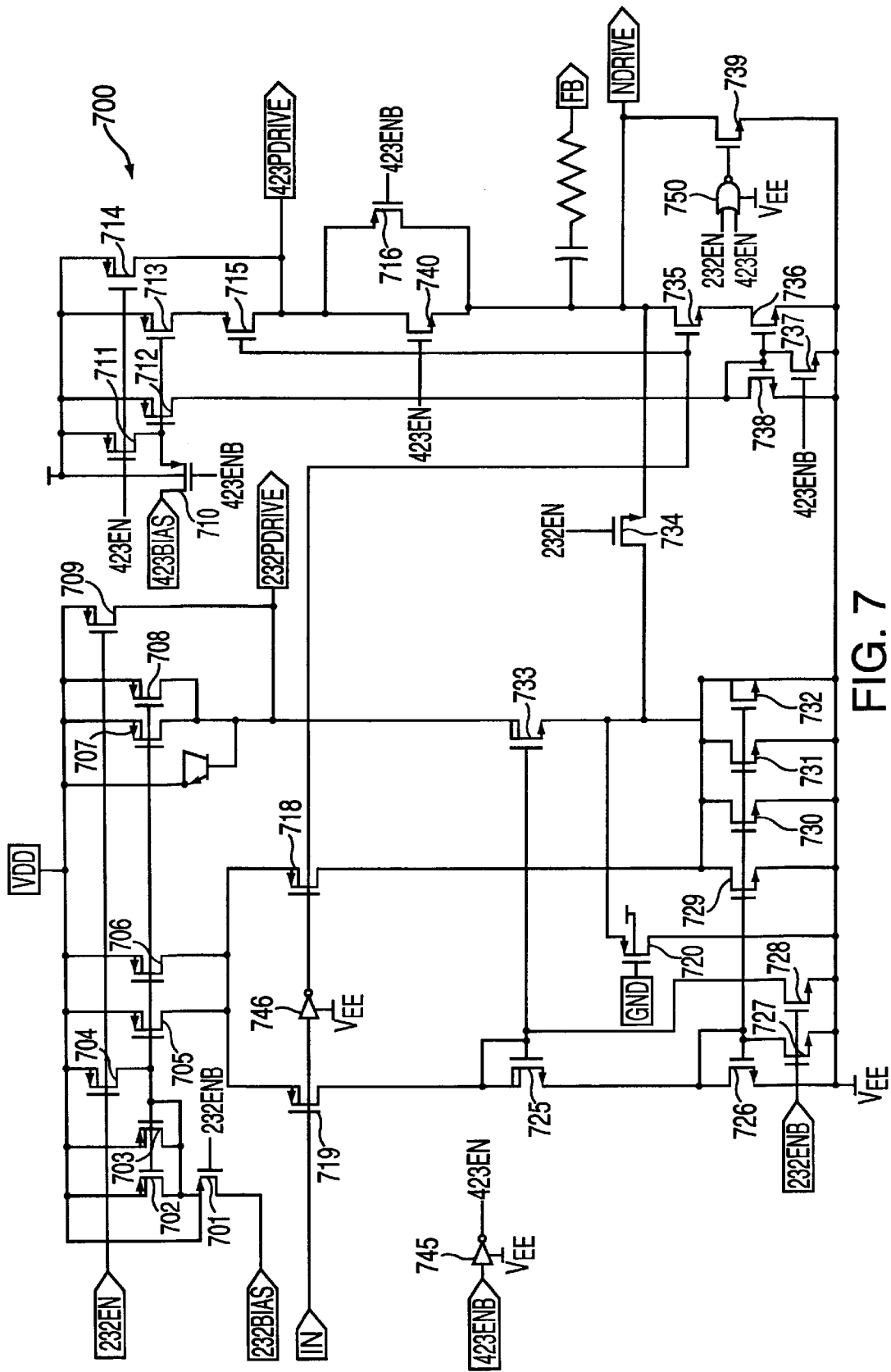
FIG. 7 is a schematic diagram of a preferred embodiment of circuitry for the single-ended driver of the interface driver circuitry of FIG. 2 according to the present invention.

For operation as a voltage-mode single-ended driver to conform an output signal to the V.28/RS-432 standard, circuitry 200 receives mode-select signal 232ENB via mode-select input terminal 104 (not shown in FIG.) and feeds that signal to level-shift circuit 250, which converts VEE logic levels to VDD logic levels. Such level-shifting circuitry is known in the art and is not described further. The output of level-shift circuit 250 is then fed to SE (single-ended) drive circuit 252, an embodiment of which is shown in FIG. 7 and described below. The non-inverted input signal from driver 201 is also supplied to SE drive circuit 252, which then generates signals 232PDRIVE and NDRIVE to drive PMOS transistor 254 and NMOS transistor 256, respectively.

Power is supplied by VDD at terminal 110 and by VEE at terminal 114. For this portion of circuitry 200, VEE is approximately −8 volts. Diodes 255 and 221, which are preferably Schottky diodes, prevent the inherent well and substrate diodes of PMOS transistor 254 and NMOS transistor 256 from undesirably turning ON when the output voltage is forced beyond supply voltage VCC or VEE. Because this portion of circuitry is configured as a single-ended driver, only output 106 is used. All other transistors in circuitry 200 are placed in a high impedance state.

Figure 5:
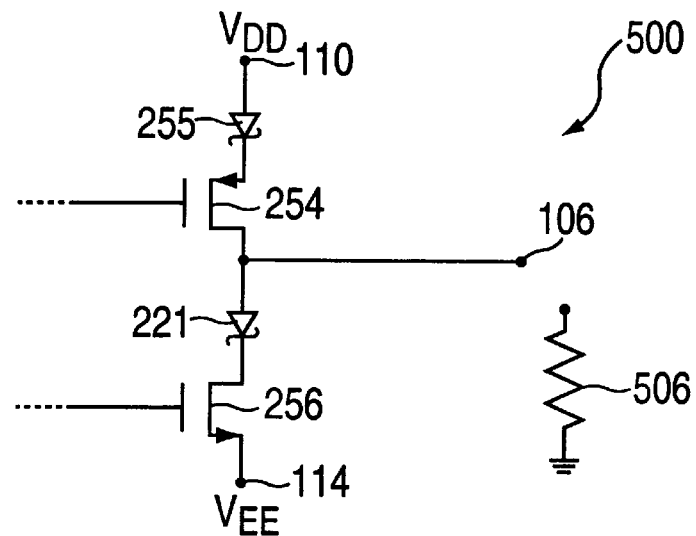
FIG. 5 is a schematic diagram of still another portion of the circuitry of FIG. 2, which can be used to conform output signals to the V.28/RS-232 electrical interface standard.

For clarity, the output stage of this single-ended circuit for the V.28/RS-232 standard is redrawn in FIG. 5. If the input signal is a logical 0, the voltage at output 106 is high. Accordingly, PMOS transistor 254 is driven ON by signal 232PDRIVE and NMOS transistor 256 is driven OFF by signal NDRIVE. When the input signal is a logical 1, the voltage at output 106 is low. Accordingly, PMOS transistor 254 is driven OFF by signal 232PDRIVE and NMOS transistor 256 is driven ON by signal NDRIVE.

To meet the V.28/RS-232 standard, the output voltage must be a minimum of +/−5 volts with a minimum load of 3k-ohms, which is represented by test load resistor 506 in FIG. 5. With VDD approximately equal to +8 volts, VEE approximately equal to −8 volts, and a voltage drop across each diode-transistor pair (e.g., diode 255 and PMOS transistor 254) of typically less than 1 volt, the voltage at output 106 is approximately +5 volts or greater when the output is a logical 1, and approximately −5 volts or less when the output is a logical 0. Thus this circuit meets the V.28/RS-232 specifications.

For operation again as a voltage-mode single-ended driver, but this time to conform an output signal to the V.10/RS-423 standard, circuitry 200 receives mode-select signal 423ENB via mode-select input terminal 104 (not shown in FIG. 2) and feeds that signal to SE drive circuit 252. In conjunction with the non-inverted input signal from driver 201, SE drive circuit 252 generates output signals 423PDRIVE and NDRIVE for driving PMOS transistor 260 and NMOS transistor 256, respectively.

Power is supplied by VCC at terminal 112 and by VEE at terminal 114. For this portion of circuitry 200, VEE is approximately −5 volts, set by the charge pump in response to mode-select signal 423ENB. Diodes 233 and 221, preferably Schottky diodes, prevent PMOS transistor 260 and NMOS transistor 256 from undesirably turning ON when the outputs are forced beyond supply voltages VCC or VEE. Again, only output 106 is used for single-ended operation. All other transistors in circuitry 200 are placed in a high impedance state.

Figure 6:
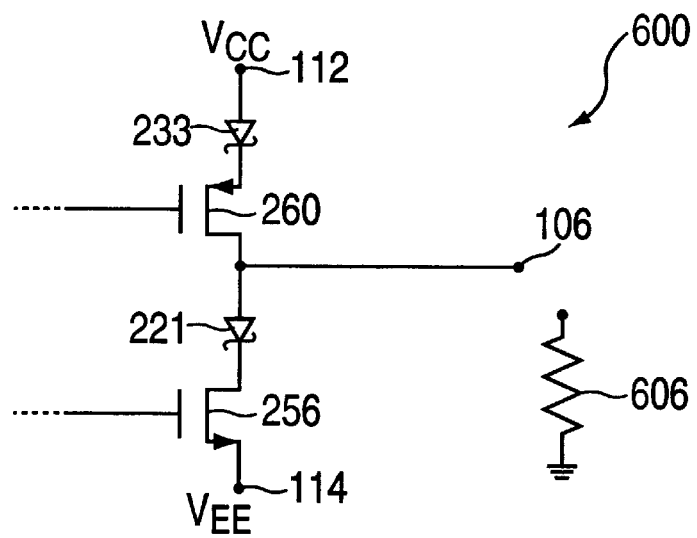
FIG. 6 is a schematic diagram of yet another portion of the circuitry of FIG. 2, which can be used to conform output signals to the V.10/RS-423 electrical interface standard.

For clarity, the output stage of this single-ended circuit for the V.10/RS-423 standard is redrawn in FIG. 6. When the input signal is a logical 0, the voltage at output 106 is high. Accordingly, PMOS transistor 260 is driven ON by signal 423PDRIVE and NMOS transistor 256 is driven OFF by signal NDRIVE. Conversely, when the input signal is a logical 1, the voltage at output 106 is low. Accordingly, PMOS transistor 260 is driven OFF by signal 423PDRIVE and NMOS transistor 256 is driven ON by signal NDRIVE.

To meet the V.10/RS-423 standard, the output must be a minimum of +/−3.6 volts with a 450-ohm load, which is represented by test load resistor 606 in FIG. 6. With VCC approximately equal to +5 volts, VEE approximately equal to −5 volts, and a voltage drop across each diode-transistor pair (e.g., diode 233 and PMOS transistor 260) of typically less than 1 volt, the voltage at output 106 is approximately +4 volts or greater when the output is a logical 1 and approximately −4 volts or less when the output is a logical 0. Thus this circuit meets the V.10/RS-423 specifications.

Circuitry 200 further includes electrostatic discharge circuitry 270 and 272 coupled to outputs 106 and 108, respectively. Such discharge circuitry is known in the art and is not discussed further. Additionally, PMOS transistor 275 is a bias transistor which mirrors the current through transistors 217/218, NMOS transistors 276–282 provide mode control, and NMOS transistors 283 and 284 form a current source cascode device that increases output impedance. Further, signals BIAS and 423BIAS provide reference currents for conformance to V.35 and V.10/RS-423 standards.

FIG. 7 is a schematic diagram of a preferred embodiment circuit for SE drive circuit 252 according to the present invention. Circuitry 700 provides drive signals for controlling the single-ended output stages of circuitry 200 for conformance to interface standards such as, for example, V.28/RS-232 and V.10/RS-423.

Circuitry 700 is preferably a CMOS circuit that includes PMOS transistors 701–720, NMOS transistors 725–740, inverting drivers 745 and 746, and NOR gate 750. Inputs to circuitry 700 include signals 423ENB, 232EN, 232BIAS, 423BIAS, and the non-inverted input signal from driver 201. Outputs from circuitry 700 include signals 423PDRIVE, 232PDRIVE, NDRIVE, and FB. Feedback signal FB helps set the slew rate for V.28/RS-232 operation. Circuitry 700 is powered by VDD, VEE, and ground, as shown in FIG. 7.

Other embodiments of the present invention may optionally exclude, for example, the V.10/RS-423 driver circuit portion, or the V.28/RS-232 or V.11/RS-422 driver circuit portions. Furthermore, while the principles of the present invention have been illustrated with respect to the particular electrical interface standards described above, other embodiments in accordance with the present invention may include circuitry for other interface standards in addition to, or instead of, the standards described above in which at least one interface standard is advantageously met by current-mode operation.

Thus it is seen that a mixed-mode multi-protocol serial interface driver is provided that can be configured via the mode-select inputs for current-mode balanced-line operation, voltage and current-mode balanced-line operation, and voltage-mode single-ended operation to conform output signals to one of a plurality of selectable electrical interface standards. Persons skilled in the art will appreciate that the present invention can be practiced by other than the described embodiments, which are presented for purposes of illustration and not of limitation, and the present invention is limited only by the claims which follow.

What is claimed is:

1. A multi-protocol serial interface driver comprising:
   an input terminal;
   a mode-select input terminal;
   first and second output terminals; and
   circuitry coupled to said input terminal, to said mode-select input terminal, and to said first and second output terminals, said circuitry operable to conform an output signal to any one of a plurality of selectable electrical interface standards, said circuitry comprising first and second current sources coupled in series such that first and second nodes are formed therebetween, said first and second output terminals respectively coupled to said first and second nodes, wherein:
   said circuitry operates in current-mode when conforming said output signal to at least one of said selectable electrical interface standards.

2. The driver of claim 1 wherein said circuitry provides a differential output signal via said first and second output terminals when operating in current-mode.

3. The driver of claim 1 wherein said circuitry operates in voltage-mode when conforming said output signal to at least one of said selectable electrical interface standards.

4. The driver of claim 3 wherein said circuitry provides a single-ended output signal via said first output terminal when operating in voltage-mode.

5. The driver of claim 1 wherein said circuitry operates in both current-mode and voltage-mode when conforming said output signal to at least one of said selectable electrical interface standards.

6. The driver of claim 5 wherein said circuitry provides a differential output signal via said first and second output terminals when operating in both current-mode and voltage-mode.

7. The driver of claim 1 wherein said circuitry further comprises single-ended driver circuitry operable to drive a portion of said circuitry in accordance with a selected electrical interface standard, said standard specifying a single-ended output signal.

8. The driver of claim 1 wherein said circuitry is integrated and packaged in a single electronic module.

9. The driver of claim 1 wherein said circuitry is implemented in CMOS.

10. The driver of claim 1 wherein one of said plurality of selectable electrical interface standards is the V.10/RS-423 electrical interface standard.

11. The driver of claim 1 wherein said mode-select signal indicates one of said selectable electrical interface standards, portions of said circuitry being enabled in response to said mode-select signal, said enabled portions conforming an output signal to said selected electrical interface standard.

12. The driver of claim 11 wherein portions of said circuitry not being used to conform an output signal to said selected electrical interface standard are placed in a high impedance state.

13. The driver of claim 12 wherein said portions of said circuitry not being used are placed in a high impedance state in response to said mode-select signal.

14. The driver of claim 12 wherein said portions of said circuitry not being used are maintained in a high impedance state when output signal voltages exceed supply voltages.

15. The driver of claim 12 wherein said portions of said circuitry not being used are maintained in a high impedance state when power to said circuitry is removed.

16. The driver of claim 12 wherein said circuitry comprises diodes for maintaining in a high impedance state said portions of said circuitry not being used.

17. The driver of claim 16 wherein said diodes are Schottky diodes.

18. The driver of claim 1 wherein one of said plurality of selectable electrical interface standards is the V.35 electrical interface standard.

19. The driver of claim 18 wherein said circuitry operates in current-mode when conforming an output signal to the V.35 electrical interface standard.

20. The driver of claim 18 wherein one of said plurality of selectable electrical interface standards is the V.11/RS-422 electrical interface standard.

21. The driver of claim 20 wherein said circuitry operates in both current-mode and voltage-mode when conforming an output signal to the V.11/RS-422 electrical interface standard.

22. The driver of claim 18 wherein one of said plurality of selectable electrical interface standards is the V.10/RS-423 electrical interface standard.

23. The driver of claim 18 wherein one of said plurality of selectable electrical interface standards is the V.28/RS-232 electrical interface standard.

24. The driver of claim 1 wherein one of said plurality of selectable electrical interface standards is the V.11/RS-422 electrical interface standard.

25. The driver of claim 1 wherein one of said plurality of selectable electrical interface standards is the V.28/RS-232 electrical interface standard.

26. The driver of claim 1 wherein portions of said circuitry are powered by a charge pump.

27. The driver of claim 26 wherein said driver and said charge pump are fabricated on the same chip.

28. A method of electrically conforming an output signal to any one of a plurality of selectable electrical interface standards with circuitry capable of operating in current-mode and voltage-mode, said circuitry including first and second current sources, said method comprising:

receiving an input signal;

receiving a mode-select signal;

enabling a portion of said circuitry that conforms an output signal to one of said selectable electrical interface standards in response to said mode-select signal; and electrically conforming said output signal to said one of said selectable electrical interface standards; wherein:

said enabled portion of said circuitry includes said first and second current sources when said circuitry operates in current-mode.

29. The method of claim 28 wherein said plurality of selectable electrical interface standards includes the V.35, V.28/RS-232, V.11/RS-422, and V.10/RS-423 standard.

30. The method of claim 28 further comprising:

placing unused portions of said circuitry in a high impedance state.

31. The method of claim 30 further comprising:

maintaining unused portions of said circuitry in a high impedance state when output voltages exceed the supply voltages.

32. The method of claim 30 further comprising:

maintaining unused portions of said circuitry in a high impedance state when power to said circuitry is removed.

33. The method of claim 28 wherein said enabling enables portions of said circuitry for current-mode operation.

34. The method of claim 28 wherein said enabling enables portions of said circuitry for voltage-mode operation.

35. The method of claim 28 wherein said enabling enables portions of said circuitry for both current-mode and voltage-mode operation.

36. The method of claim 28 wherein said circuitry further includes single-ended output circuitry and said enabling further comprises:

generating drive signals for driving said single-ended output circuitry; and driving said single-ended output circuitry.

37. The method of claim 28 wherein said plurality of selectable electrical interface standards includes the V.35 standard.

38. The method of claim 37 wherein selection of the V.35 standard enables current-mode operation.

39. The method of claim 28 wherein said plurality of selectable electrical interface standards includes the V.35 standard and the V.28/RS-232 standard.

40. The method of claim 28 wherein said plurality of selectable electrical interface standards includes the V.35 standard and the V.11/RS-422 standard.

41. The method of claim 28 wherein said plurality of selectable electrical interface standards includes the V.35 standard and the V.10/RS-423 standard.

* * * * *

UNITED STATES PATENT AND TRADEMARK OFFICE
CERTIFICATE OF CORRECTION

PATENT NO    : 6,005,414

DATED        : December 21, 1999

INVENTION(S) : Robert Loren Reay

It is certified that error appears in the above-identified patent and that said Letters Patent are hereby corrected as shown below:

Column 1, line 48, "Télephone" should be --Téléphone--.

Column 2, line 49, "multiprotocol" should be --multi-protocol--.

Column 6, line 16, "high-impedance" should be --high impedance--; and line 64, "PROS" should be --PMOS-.

Column 8, line 57, "FIG.)" should be --FIG. 2)--.

Claim 29, column 12, line 27, "standard" should be --standards--.

Signed and Sealed this

First Day of May, 2001

*Attest:*

NICHOLAS P. GODICI

*Attesting Officer*   *Acting Director of the United States Patent and Trademark Office*